(12) United States Patent
Sasaki

(10) Patent No.: US 9,627,503 B2
(45) Date of Patent: Apr. 18, 2017

(54) BIPOLAR TRANSISTOR, SEMICONDUCTOR DEVICE, AND BIPOLAR TRANSISTOR MANUFACTURING METHOD

(71) Applicant: Murata Manufacturing Co., Ltd., Kyoto (JP)

(72) Inventor: Kenji Sasaki, Kyoto (JP)

(73) Assignee: MURATA MANUFACTURING CO., LTD, Kyoto (JP)

( * ) Notice: Subject to any disclaimer, the term of this patent is extended or adjusted under 35 U.S.C. 154(b) by 0 days.

(21) Appl. No.: 15/073,802

(22) Filed: Mar. 18, 2016

(65) Prior Publication Data

US 2016/0204235 A1 Jul. 14, 2016

Related U.S. Application Data

(62) Division of application No. 14/328,737, filed on Jul. 11, 2014, now abandoned.

(30) Foreign Application Priority Data

Jul. 31, 2013 (JP) ................. 2013-159358

(51) Int. Cl.
*H01L 29/737* (2006.01)
*H01L 29/66* (2006.01)
(Continued)

(52) U.S. Cl.
CPC .... *H01L 29/66318* (2013.01); *H01L 23/4824* (2013.01); *H01L 23/535* (2013.01);
(Continued)

(58) Field of Classification Search
CPC .......... H01L 27/0688; H01L 29/66318; H01L 21/8248
See application file for complete search history.

(56) References Cited

U.S. PATENT DOCUMENTS

| | | | | |
|---|---|---|---|---|
| 6,828,603 B2 * | 12/2004 | Yanagisawa | ...... | H01L 21/76838 257/183 |
| 6,888,180 B2 * | 5/2005 | Kotani | ................ | H01L 29/0821 257/191 |
| 6,933,545 B2 | 8/2005 | Kawasaki et al. | | |
| 7,718,486 B2 | 5/2010 | Krutko et al. | | |
| 7,829,917 B1 | 11/2010 | Thomas | | |
| 2001/0045619 A1 | 11/2001 | Dekker et al. | | |

(Continued)

FOREIGN PATENT DOCUMENTS

| | | |
|---|---|---|
| JP | H05-048078 A | 2/1993 |
| JP | 2004-327904 A | 11/2004 |
| JP | 2004-363322 A | 12/2004 |

*Primary Examiner* — Eugene Lee
(74) *Attorney, Agent, or Firm* — Pearne & Gordon LLP

(57) ABSTRACT

Disconnection of a base line is suppressed even when a short-side direction of a collector layer is parallel to crystal orientation [011]. A bipolar transistor includes: a collector layer that has a long-side direction and a short-side direction in a plan view, in which the short-side direction is parallel to crystal orientation [011], a cross-section perpendicular to the short-side direction has an inverted mesa shape, and a cross-section perpendicular to the long-side direction has a forward mesa shape; a base layer that is formed on the collector layer; a base electrode that is formed on the base layer; and a base line that is connected to the base electrode and that is drawn out from an end in the short-side direction of the collector layer to the outside of the collector layer in a plan view.

5 Claims, 10 Drawing Sheets

(51) Int. Cl.
*H01L 23/535* (2006.01)
*H01L 27/082* (2006.01)
*H01L 29/06* (2006.01)
*H01L 29/08* (2006.01)
*H01L 23/66* (2006.01)
*H01L 25/065* (2006.01)
*H01L 23/482* (2006.01)
*H01L 27/06* (2006.01)
*H01L 29/205* (2006.01)

(52) U.S. Cl.
CPC .......... *H01L 23/66* (2013.01); *H01L 25/0655* (2013.01); *H01L 27/0605* (2013.01); *H01L 27/0823* (2013.01); *H01L 29/0692* (2013.01); *H01L 29/0821* (2013.01); *H01L 29/7371* (2013.01); *H01L 29/205* (2013.01); *H01L 2224/49111* (2013.01); *H01L 2224/49171* (2013.01); *H01L 2924/1305* (2013.01)

(56) References Cited

U.S. PATENT DOCUMENTS

| | | | |
|---|---|---|---|
| 2002/0105011 A1* | 8/2002 | Yaegashi | H01L 29/045 257/197 |
| 2003/0160266 A1 | 8/2003 | Yanagisawa | |
| 2003/0218184 A1 | 11/2003 | Yanagisawa | |
| 2003/0232478 A1 | 12/2003 | Hiratsuka | |
| 2005/0017267 A1 | 1/2005 | Kawasaki et al. | |
| 2006/0108665 A1* | 5/2006 | Kurokawa | H01L 27/0605 257/592 |

* cited by examiner

BIPOLAR TRANSISTOR, SEMICONDUCTOR DEVICE, AND BIPOLAR TRANSISTOR MANUFACTURING METHOD

CROSS-REFERENCE TO RELATED APPLICATIONS

This application is a division of U.S. patent application Ser. No. 14/328,737 filed Jul. 1, 2014, the entire disclosure of which is incorporated by reference herein.

BACKGROUND OF THE INVENTION

Field of the Invention

The present invention relates to a bipolar transistor, a semiconductor device, and a bipolar transistor manufacturing method.

Background Art

In the related art, development of a bipolar transistor having a collector layer, a base layer, and an emitter layer on a substrate has been attempted.

Patent Document 1 discloses a bipolar transistor in which a base line connected to a base electrode coming into contact with a base layer is drawn out from an end in a long-side direction of a rectangular collector layer in a plan view.

CITATION LIST

Patent Document

[Patent Document 1] JP2004-327904 A

SUMMARY OF THE INVENTION

However, in the bipolar transistor described in Patent Document 1, since the collector layer is wet-etched, etching anisotropy may occur depending on crystal orientations of the collector layer. As a result, in the collector layer, a cross-section perpendicular to crystal orientation [011] has an inverted mesa shape and a cross-section extending along crystal orientation [011] has a forward mesa shape.

Here, the base line is drawn out from an end in the long-side direction of the collector layer. Accordingly, when the short-side direction of the collector layer extends along crystal orientation [011], the base line is drawn out from an end of the collector layer having an inverted mesa shape to the outside of the collector layer and thus may be disconnected due to step difference of the mesa.

An object of the present invention is to suppress disconnection of a base line even when a short-side direction of a collector layer extends along crystal orientation [011].

According to an aspect of the present invention, there is provided a bipolar transistor including: a collector layer that has a long-side direction and a short-side direction in a plan view, in which the short-side direction is parallel to crystal orientation [011], a cross-section perpendicular to the short-side direction has an inverted mesa shape, and a cross-section perpendicular to the long-side direction has a forward mesa shape; a base layer that is formed on the collector layer; a base electrode that is formed on the base layer; and a base line that is connected to the base electrode and that is drawn out from an end in the short-side direction of the collector layer to the outside of the collector layer in a plan view.

According to the present invention, it is possible to suppress disconnection of a base line even when a short-side direction of a collector layer extends along crystal orientation [011].

DESCRIPTION OF THE PREFERRED EMBODIMENTS

Figure 1:
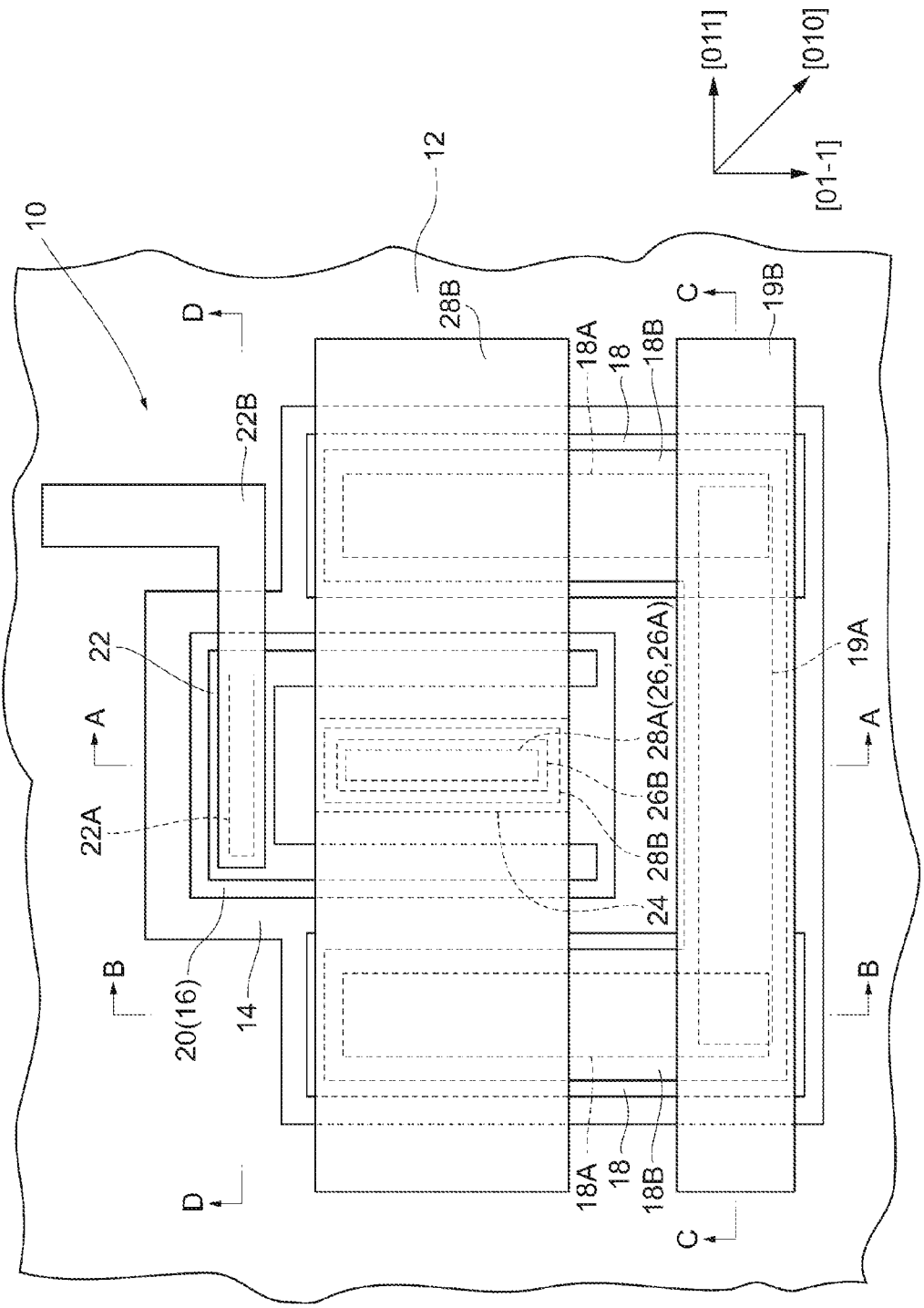
FIG. 1 is a plan view of an HBT as an example of a bipolar transistor according to a first embodiment of the present invention.

Hereinafter, embodiments of the present invention will be described with reference to the accompanying drawings. The embodiments to be described below are only examples and are not intended to exclude application of various modifications or techniques not described below. That is, the present invention may be modified in various forms (for example, combinations of the embodiments) without departing from the gist of the present invention. In the following description with reference to the accompanying drawings, identical or similar elements are referenced by identical or similar reference signs. The drawings are schematic and are not necessarily equal to actual dimensions, ratios, and the like. Parts having different dimensional relationships or ratios may be present in the drawings.

First Embodiment

A bipolar transistor according to a first embodiment of the present invention mainly includes a collector layer, a base layer, and an emitter layer on a substrate. In the first embodiment of the present invention, a hetero-junction bipolar transistor (hereinafter, referred to as "HBT") in which at least one of a pair of the collector layer and the base layer and a pair of the base layer and the emitter layer has a hetero-junction connection is described as an example of the bipolar transistor.

Structure

Figure 2:
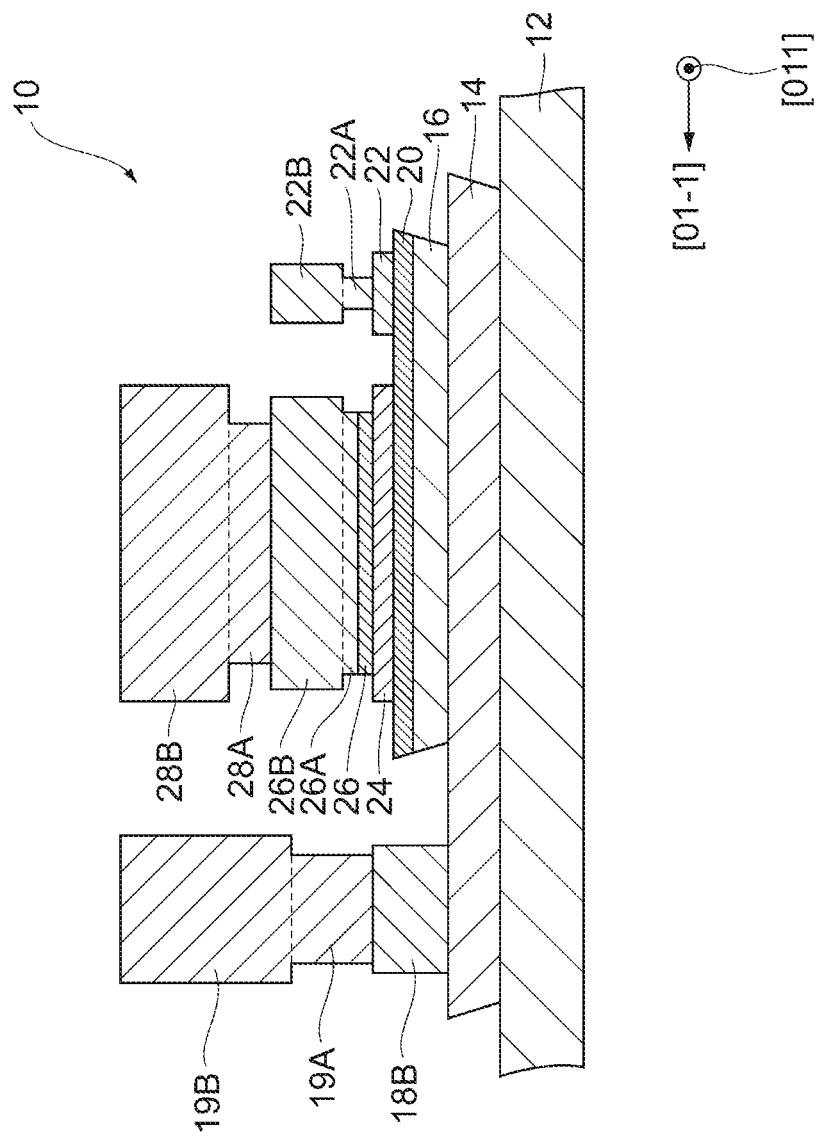
FIG. 2 is a cross-sectional view taken along line A-A of FIG. 1.
Figure 3:
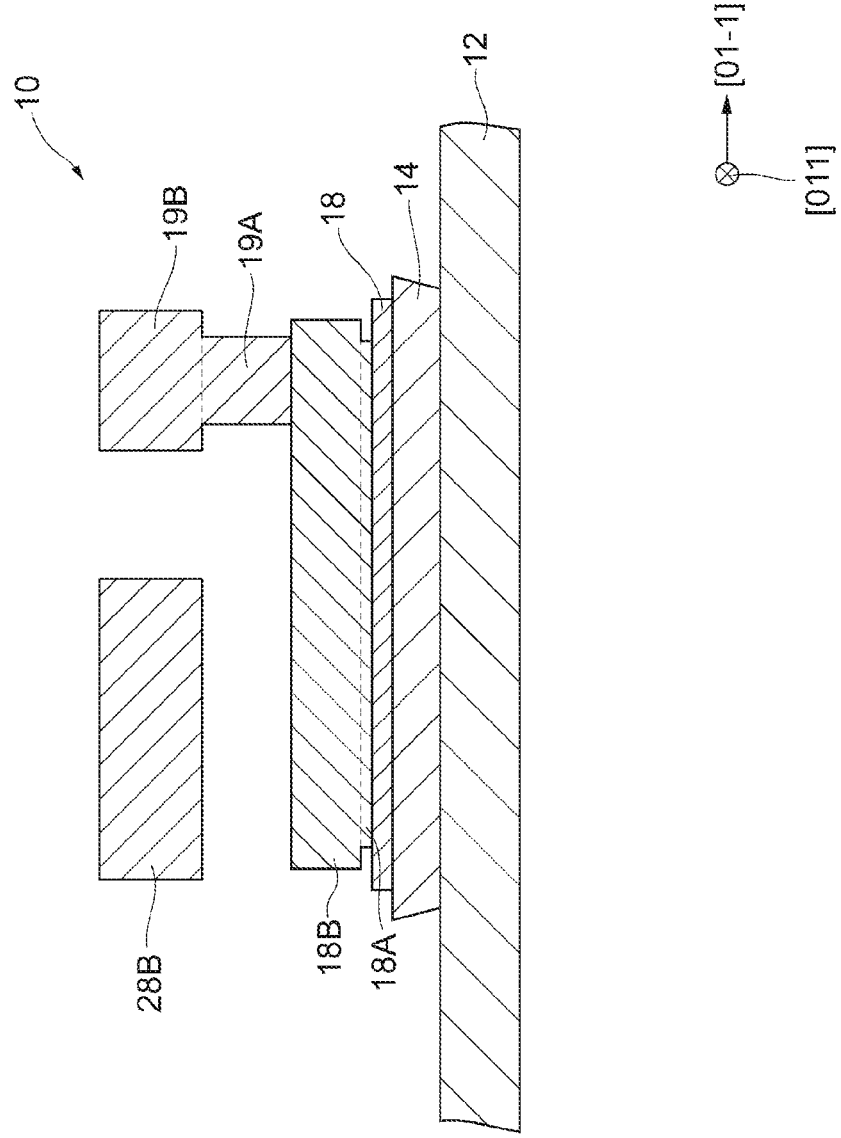
FIG. 3 is a cross-sectional view taken along line B-B of FIG. 1.
Figure 4:
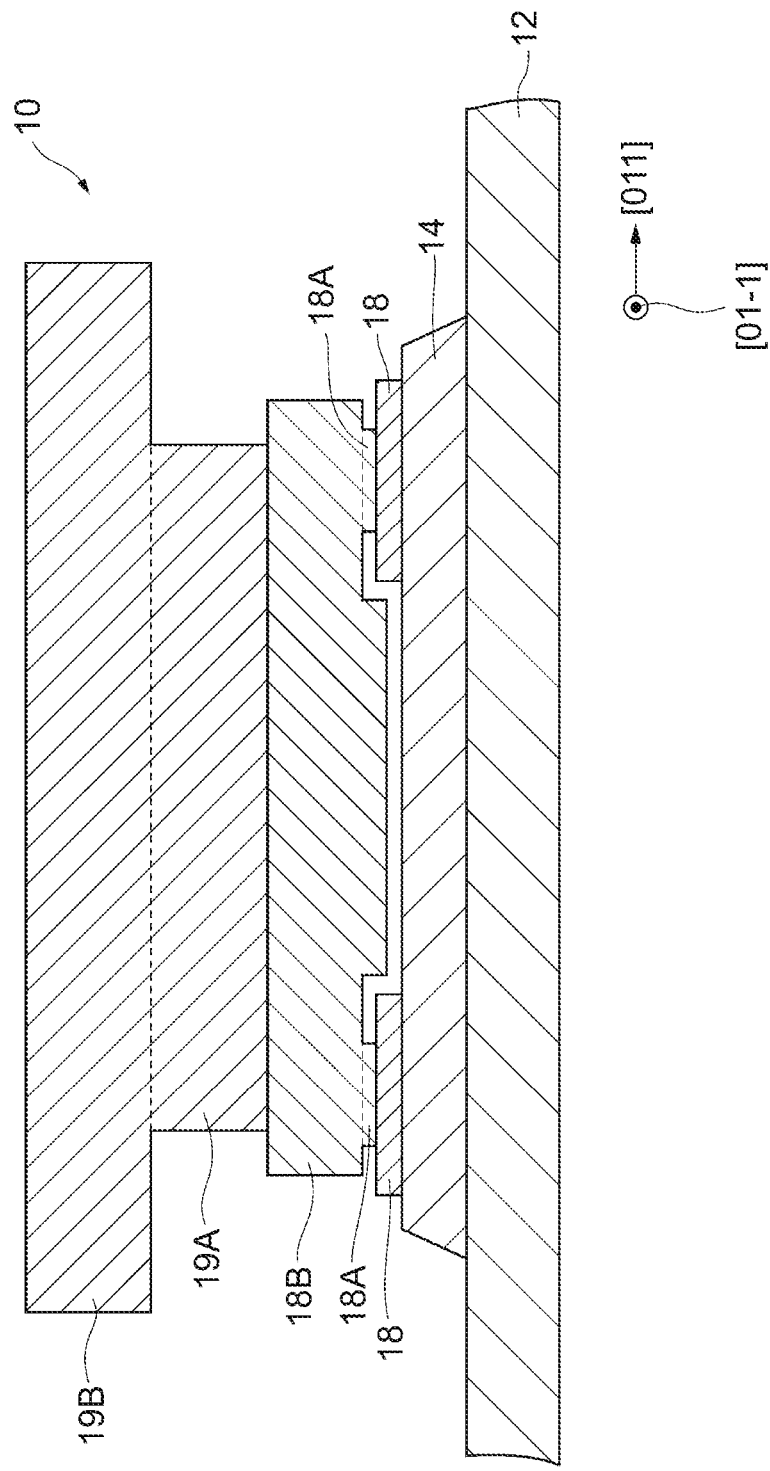
FIG. 4 is a cross-sectional view taken along line C-C of FIG. 1.
Figure 5:
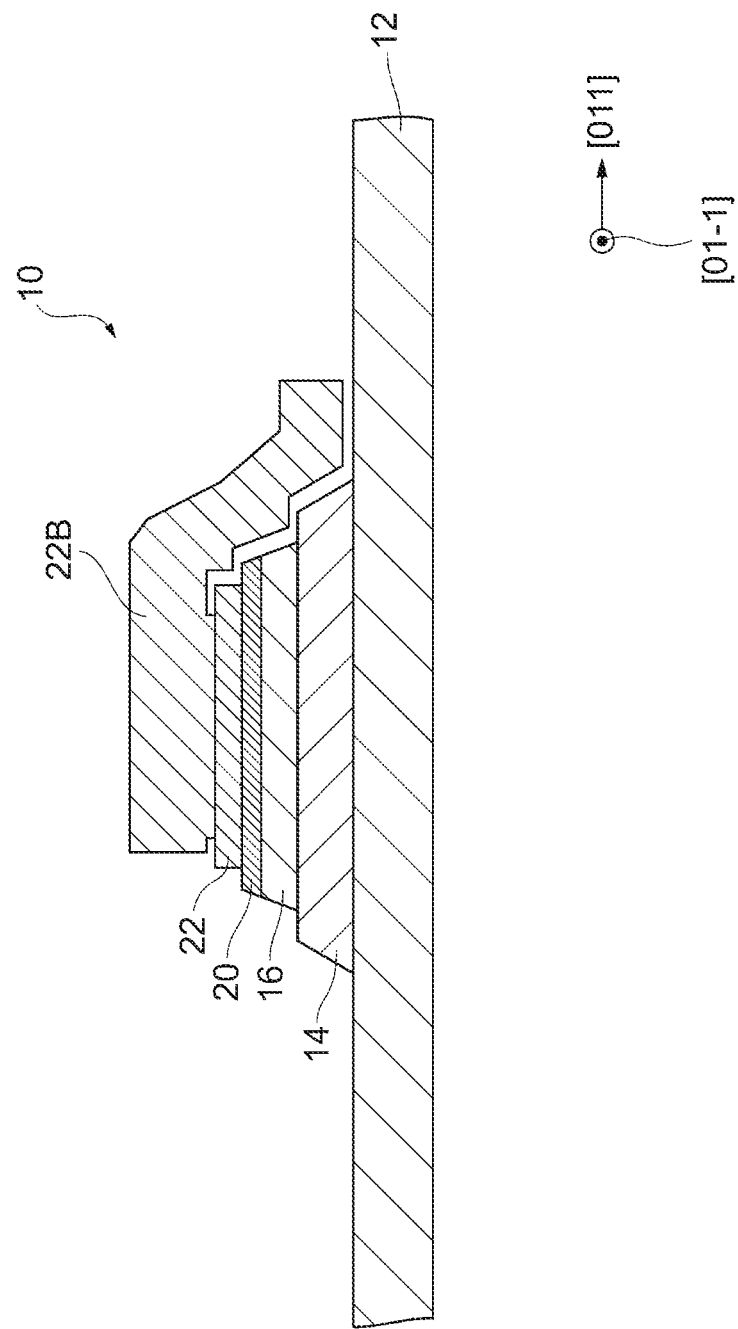
FIG. 5 is a cross-sectional view taken along line D-D of FIG. 1.

First, the structure of the HBT according to the first embodiment will be described below. FIG. 1 is a plan view of an HBT 10 as an example of the bipolar transistor according to the first embodiment of the present invention. FIG. 2 is a cross-sectional view taken along line A-A of FIG. 1. FIG. 3 is a cross-sectional view taken along line B-B of FIG. 1. FIG. 4 is a cross-sectional view taken along line C-C of FIG. 1. FIG. 5 is a cross-sectional view taken along line D-D of FIG. 1.

The HBT 10 according to this embodiment is formed on a substrate, for example, a panel-like compound semiconductor substrate 12.

The material of the compound semiconductor substrate 12 is not particularly limited and an example thereof is a material having a crystal structure. Examples of the material having a crystal structure include GaAs, Si, InP, SiC, and GaN. Among these materials, it is preferable that the substrate contains GaAs or Si, which is lower in cost than InP or the like and easily increases in diameter, as a major component. Here, the "major component" means that the ratio of a material as a major component to a substrate or a layer as a whole is 80 mass % or more. In this embodiment, the compound semiconductor substrate 12 is formed of, for example, GaAs. In FIG. 1 or the like, crystal orientation [011], crystal orientation [010], and crystal orientation [01-1] are illustrated as some crystal orientations of GaAs.

The HBT 10 includes a sub collector layer 14, a collector layer 16, a collector electrode 18, a base layer 20, a base electrode 22, an emitter layer 24, and an emitter electrode 26.

The sub collector layer 14 is formed on a partial surface of the compound semiconductor substrate 12. The material of the sub collector layer 14 is not particularly limited, and an example thereof is a material having a crystal structure. A zinc blende type crystal structure can be preferably used as the crystal structure. In this embodiment, the sub collector layer 14 is formed of, for example, the same material as the compound semiconductor substrate 12, which contains n-type GaAs (Si concentration of $5 \times 10^{18}$ cm$^{-3}$) as a major component. The crystal orientation of GaAs of the sub collector layer 14 is parallel to, for example, the crystal orientation of GaAs of the compound semiconductor substrate 12.

The shape of the sub collector layer 14 in a plan view is, for example, a protrusion shape (see FIG. 1). The protruding direction of the sub collector layer 14 is substantially parallel to crystal orientation [01-1] of the sub collector layer 14 (hereinafter, "substantially parallel to" is referred to as "extend along"). In the sub collector layer 14, a cross-section perpendicular to crystal orientation [011] thereof has an inverted mesa shape (see FIGS. 2 and 3) and a cross-section extending along crystal orientation [011] thereof has a forward mesa shape (see FIGS. 4 and 5). In other words, both side surfaces in the protruding direction of the sub collector layer 14 are inverted mesa surfaces, and both side surfaces in the width direction perpendicular to the protruding direction are forward mesa surfaces. The thickness of the sub collector layer 14 is, for example, about 0.5 μm.

The "forward mesa shape" means a trapezoidal shape having a narrow top (the sub collector layer 14 side relative to the compound semiconductor substrate 12), and the "inverted mesa shape" means a trapezoidal shape having a broad top. The "forward mesa surface" means an inclined surface which forms an obtuse angle with a top flat surface, and the "inverted mesa surface" means an inclined surface which forms an acute angle with the top flat surface. The "substantially parallel" means that an angle about a target parallel direction (for example, crystal orientation [01-1]) is 0 degrees±20 degrees. In this embodiment, more specifically, the protruding direction of the sub collector layer 14 is parallel to crystal orientation [01-1] of the sub collector layer 14 (that is, the angle is 0 degrees). The sub collector layer 14 has low ohm resistance and thus serves as a collector along with the collector layer 16.

The collector layer 16 is formed at the center in the width direction of the sub collector layer 14 on the sub collector layer 14 (see FIGS. 1 and 2). The material of the collector layer 16 is not particularly limited, and an example thereof is a material having a crystal structure. A zinc blende type crystal structure can be preferably used as the crystal structure. In this embodiment, the collector layer 16 is formed of, for example, the same material as the sub collector layer 14, which contains GaAs as a major component. The crystal orientation of GaAs of the collector layer 16 is parallel to, for example, the crystal orientation of GaAs of the compound semiconductor substrate 12.

Since GaAs as the major component of the collector layer 16 has better thermal conductivity than ordered InGaP which has been used in the related art, a heat dissipation property to the collector layer 16 side is improved and transistor characteristics in a high-temperature operation or a high-power operation are improved.

The collector layer 16 containing GaAs as a whole may be formed of n-type semiconductor or p-type semiconductor. When the collector layer 16 is formed of n-type semiconductor, the HBT 10 has an npn junction. When the collector layer 16 is formed of p-type semiconductor, the HBT 10 has a pnp junction. Here, since the hole mobility of GaAs is much lower than the electron mobility (the electron mobility is about 0.85 m$^2$/(V·s) and the hole mobility is about 0.04 m$^2$/(V·s)), n-type semiconductor can be preferably used from the viewpoint that the frequency characteristics are more excellent than those of the pnp junction. Hereinafter, it is assumed in this embodiment that the collector layer 16 is formed of n-type semiconductor. In order to set the collector layer 16 to the n type, the collector layer 16 is doped with dopants such as Si, S, Se, Te, and Sn. In order to set the collector layer 16 to the p type, the collector layer 16 is doped with dopants such as C, Mg, Be, Zn, and Cd.

The shape of the collector layer 16 in a plan view is, for example, a rectangular shape long in one direction (see FIG. 1). The long-side direction of the rectangular shape (collector layer 16) extends along crystal orientation [01-1] of the collector layer 16. The short-side direction of the collector layer 16 extends along crystal orientation [011] of the collector layer 16. The shape of the collector layer 16 when viewed from crystal orientation [011] is an inverted mesa shape (see FIG. 2) and the shape thereof when viewed from crystal orientation [01-1] perpendicular to crystal orientation [011] is a forward mesa shape (see FIG. 5). In other words, the cross-section perpendicular to the short-side direction of the collector layer 16 has an inverted mesa shape and the cross-section perpendicular to the long-side direction of the collector layer 16 is a forward mesa shape. In other words, both side surfaces in the long-side direction of the collector layer 16 are inverted mesa surfaces and both side surfaces in the short-side direction of the collector layer 16 are forward mesa surfaces. The thickness of the collector layer 16 is, for example, equal to or greater than 0.5 μm and equal to or less than 1.5 μm.

The collector electrode 18 (a pair) is formed on both sides in the width direction of the sub collector layer 14 with the collector layer 16 interposed therebetween on the sub collector layer 14 (see FIG. 1).

The shape of each collector electrode 18 in a plan view is, for example, rectangular. The long-side direction of the rectangular shape (collector electrode 18) extends along crystal orientation [01-1] of the collector layer 16. The material of the collector electrodes 18 is not particularly limited and examples thereof include Ti/Pt, WSi, Pt/Ti/Au, and AuGe/Ni/Au. Preferably, AuGe/Ni/Au can be used as the material of the collector electrodes 18. In a plan view, the pair of collector electrodes 18 retreats to crystal orientation [01-1] of the collector layer 16 with respect to the collector layer 16. In other words, the collector layer 16 protrudes in the protruding direction of the sub collector layer 14 with respect to the pair of collector electrodes 18.

The collector electrodes 18 are connected to the same collector line 18B via respective contact holes 18A. The collector line 18B is connected to a collective collector line 19B of an upper layer via a contact hole 19A in an upper layer thereon.

The contact holes 18A are formed of, for example, the same material as the collector line 18B. The lateral outer circumference of each contact hole 18A is surrounded with, for example, a protective film as an insulator not illustrated.

The shape of the collector line 18B in a plan view is, for example, a recess shape (see FIG. 1). The recessed portion of the recess shape is opened to the protruding portion of the sub collector layer 14. The recessed portion surrounds a part of the base layer 20, the emitter layer 24, or the like located at the center in the width direction of the sub collector layer 14.

The base layer 20 is formed on the collector layer 16 (see FIGS. 1 and 2). The material of the base layer 20 is not particularly limited, and an example thereof is a material having a crystal structure. A zinc blende type crystal structure can be preferably used as the crystal structure. In this embodiment, the base layer 20 is formed of, for example, the same material as the sub collector layer 14 and the collector layer 16, which contains GaAs as a major component. The crystal orientation of GaAs of the base layer 20 is parallel to, for example, the crystal orientation of GaAs of the compound semiconductor substrate 12.

GaAs as a major component of the base layer 20 may be n-type semiconductor or p-type semiconductor. In this embodiment, since the collector layer 16 is formed of n-type semiconductor, GaAs of the base layer 20 is p-type semiconductor.

The shape of the base layer 20 in a plan view is, for example, a rectangular shape long in one direction (see FIG. 1). The long-side direction of the rectangular shape (base layer 20) extends along crystal orientation [01-1] of the base layer 20. The short-side direction of the base layer 20 extends along crystal orientation [011] of the base layer 20. The shape of the base layer 20 when viewed from crystal orientation [011] is an inverted mesa shape (see FIG. 2) and the shape thereof when viewed from crystal orientation [01-1] perpendicular to crystal orientation [011] is a forward mesa shape (see FIG. 5). In other words, the cross-section perpendicular to the short-side direction of the base layer 20 has an inverted mesa shape and the cross-section perpendicular to the long-side direction of the base layer 20 is a forward mesa shape. In other words, both side surfaces in the long-side direction of the base layer 20 are inverted mesa surfaces and both side surfaces in the short-side direction of the base layer 20 are forward mesa surfaces. The thickness of the base layer 20 is, for example, equal to or greater than 0.05 μm and equal to or less than 0.15 μm.

The base electrode 22 is formed on the base layer 20 (see FIGS. 2 and 5). The shape of the base electrode 22 in a plan view is, for example, a recess shape (see FIG. 1). The recessed portion of the recess shape is opened (recessed) when viewed from crystal orientation [01-1] of the base layer 20. The recessed portion surrounds a part of the emitter layer 24 and the like. The material of the base electrode 22 is not particularly limited and examples thereof include Ti/Pt, WSi, Pt/Ti/Au, and AuGe/Ni/Au. Preferably, Pt/Ti/Au can be used as the material of the base electrode 22.

The base electrode 22 is connected to the base line 22B via a contact hole 22A.

The contact hole 22A is formed of, for example, the same material as the base line 22B. The lateral outer circumference of the contact hole 22A is surrounded with, for example, a protective film as an insulator not illustrated.

The shape of the base line 22B in a plan view is, for example, an L-shape (see FIG. 1). An end of the L-shape (base line 22B) is connected to the base electrode 22. The base line 22B is drawn out from a connection area thereof to the base electrode 22 and from an end in the short-side direction of the base layer 20 and the collector layer 16 to the outside of the sub collector layer 14 (see FIGS. 1 and 5). More specifically, in this embodiment, the base line 22B is straightly drawn out along (in parallel to) the short-side direction of the collector layer 16, that is, crystal orientation [011] of the collector layer 16. As a result, the base line 22B goes over the side surfaces which are the forward mesa surfaces of the base layer 20, the collector layer 16, and the sub collector layer 14.

The base line 22B is, for example, bent at right angle and extends along the long-side direction of the collector layer 16 after being drawn out to the outside of the sub collector layer 14. The other end of the base line 22B as an extending destination is connected to a metal pad or the like via a collective base line not illustrated.

The emitter layer 24 is formed on the base layer 20 (see FIG. 2). The emitter layer 24 has, for example, a rectangular shape long in one direction (see FIG. 1). The long-side direction of the emitter layer 24 extends along crystal orientation [01-1] of the base layer 20.

The material of the emitter layer 24 is not particularly limited as long as it is semiconductor. In this embodiment, since the emitter layer 24 is hetero-joined to the base layer 20, it is preferable that the emitter layer 24 be formed of semiconductor having a material lattice-matched with the major component of the base layer 20 as a major component. Specifically, when the base layer 20 contains $Al_yGa_{1-y}As$ or GaAs as a major component, it is preferable that the emitter layer be formed of semiconductor containing InGaP or $Al_yGa_{1-y}As$ as a major component.

The emitter electrode 26 is formed on the emitter layer 24 (see FIG. 2). The material of the emitter electrode 26 is not particularly limited and examples thereof include Ti/Pt, WSi, and AuGe/Ni/Au.

The emitter electrode 26 is connected to the emitter line 26B via the contact hole 26A. The emitter line 26B is connected to a collective emitter line 28B of an upper layer via a contact hole 28A in an upper layer thereon.

The contact hole 26A is formed of, for example, the same material as the emitter line 26B. The lateral outer circumference of the contact hole 26A is surrounded with, for example, a protective film as an insulator not illustrated.

The shape of the emitter line 26B in a plan view is, for example, a rectangular shape (see FIG. 1). The long-side direction of the emitter line 26B extends along crystal orientation [01-1] of the base layer 20.

The contact hole 28A is formed of, for example, the same material as the collective emitter line 28B. The lateral outer circumference of the contact hole 28A is surrounded with, for example, a protective film as an insulator not illustrated.

The shape of the collective emitter line 28B in a plan view is, for example, a rectangular shape (see FIG. 1). The long-side direction of the collective emitter line 28B extends along crystal orientation [011] of the base layer 20.

Manufacturing Method

A method of manufacturing the HBT 10 according to the first embodiment will be schematically described below.

The sub collector layer 14, the collector layer 16, the base layer 20, and the emitter layer 24 are sequentially formed on the compound semiconductor substrate 12, for example, using a metal organic chemical vapor deposition (MOCVD) method (see FIG. 2).

Then, the emitter electrode 26 is deposited on the emitter layer 24 using a photoresist process.

Then, the emitter layer 24 not covered with the emitter electrode 26 is etched until the base layer 20 is exposed. Then, the base electrode 22 is deposited on the exposed base layer 20.

Then, the base layer 20 and the collector layer 16 under the base layer 20 are wet-etched until the sub collector layer 14 is exposed. Then, the sub collector layer 14 is wet-etched. The short-side directions and the long-side directions are determined so that the short-side directions of the base layer 20 and the collector layer 16 extend along crystal orientation [011] (both are parallel to the same direction) at the time of etching the base layer 20 and the collector layer 16, and the wet etching is performed thereon. Since this etching is wet etching, etching anisotropy (with different etching rates) occurs depending on the crystal orientations of the base layer 20, the collector layer 16, or the sub collector layer 14. As a result, the base layer 20, the collector layer 16, and the sub collector layer 14 have an inverted mesa shape when viewed from crystal orientation [011] and have a forward mesa shape when viewed from the direction perpendicular to crystal orientation [011].

Then, a pair of collector electrodes 18 is formed at both ends in the width direction of the sub collector layer 14 with the collector layer 16 interposed therebetween on the sub collector layer 14 using a lift-off method.

Then, a protective film such as an SiN film is formed from a side of the compound semiconductor substrate 12 on which various layers such as the sub collector layer 14 are formed using a plasma CVD method or the like.

Then, the formed protective film is dry-etched so as to expose at least a part of each of the collector electrode 18, the base electrode 22, and the emitter electrode 26.

Then, the corresponding collector line 18B, the corresponding base line 22B, and the corresponding emitter line 26B are formed on the exposed collector electrode 18, the exposed base electrode 22, and the exposed emitter electrode 26 via the contact holes 18A, 22A, and 26A using a physical vapor deposition method such as a sputtering method or a deposition method and a lift-off method. Here, the base line 22B is formed to be drawn out from an end in the short-side direction of the collector layer 16.

Then, a protective film such as an SiN film is formed from the side of the compound semiconductor substrate 12 on which various layers such as the sub collector layer 14 are formed using an MOCVD method or the like.

Then, the formed protective film is dry-etched so as to expose at least a part of each of the collector line 18B, the base line 22B, and the emitter line 26B.

Then, a polyimide film is applied thereto for planarization. The polyimide film on the portion from which the protective film is etched is etched so as to expose at least a part of each of the collector line 18B, the base line 22B, and the emitter line 26B.

Then, the corresponding collective collector line 19B, the corresponding collective base line (not illustrated), and the corresponding collective emitter line 28B are formed on the exposed collector line 18B, the exposed base line 22B, and the exposed emitter line 26B via the contact holes 19A and 28A and the like using a physical vapor deposition method such as a sputtering method or a deposition method and a lift-off method.

The HBT 10 illustrated in FIGS. 1 to 5 is manufactured through the use of the above-mentioned manufacturing steps.

Operation

The above-mentioned HBT 10 according to this embodiment includes the collector layer 16 in which the short-side direction extends along crystal orientation [011] of the collector layer 16, in which the cross-section perpendicular to the short-side direction has an inverted mesa shape, and in which the cross-section perpendicular to the long-side direction has a forward mesa shape and the base line 22B that is drawn out from an end in the short-side direction of the collector layer 16 to the outside of the collector layer 16.

As a result, the base line 22B goes over the side surface which is the forward mesa surface of the collector layer 16. Accordingly, even when the short-side direction of the collector layer 16 extends along crystal orientation [011], it is possible to suppress disconnection of the base line 22B in comparison with a case where the base line goes over the side surface which is the inverted mesa surface of the collector layer 16.

In the HBT 10 according to this embodiment, similarly to the base layer 20, the short-side direction extends along crystal orientation [011], the cross-section perpendicular to the short-side direction has an inverted mesa shape, and the cross-section perpendicular to the long-side direction has a forward mesa shape.

As a result, the base line 22B goes over the side surface which is the forward mesa surface of the base layer 20. Accordingly, even when the short-side direction of the base layer 20 extends along crystal orientation [011], it is possible to suppress disconnection of the base line 22B in comparison with a case where the base line goes over the side surface which is the inverted mesa surface of the base layer 20.

The HBT 10 according to this embodiment further includes the sub collector layer 14 that is formed between the compound semiconductor substrate 12 and the collector layer 16 and that has the same crystal orientations as the collector layer 16, in which the cross-section perpendicular to the short-side direction of the collector layer 16 has an inverted mesa shape and the cross-section perpendicular to the long-side direction of the collector layer 16 has a forward mesa shape.

As a result, the base line 22B goes over the side surface which is the forward mesa surface of the sub collector layer 14. Accordingly, in comparison with a case where the base line goes over the side surface which is the inverted mesa surface of the sub collector layer 14, it is possible to suppress disconnection of the base line 22B.

In the HBT 10 according to this embodiment, the compound semiconductor substrate 12 includes a GaAs substrate. When the GaAs substrate is selected as the compound semiconductor substrate 12, the cost is lower than that of InP or the like and an increase in diameter is facilitated.

Second Embodiment

An HBT according to a second embodiment of the present invention will be described below.

The HBT according to the second embodiment is different from the HBT according to the first embodiment, in a base line drawing method. The other configurations are the same as in the first embodiment.

Figure 6:
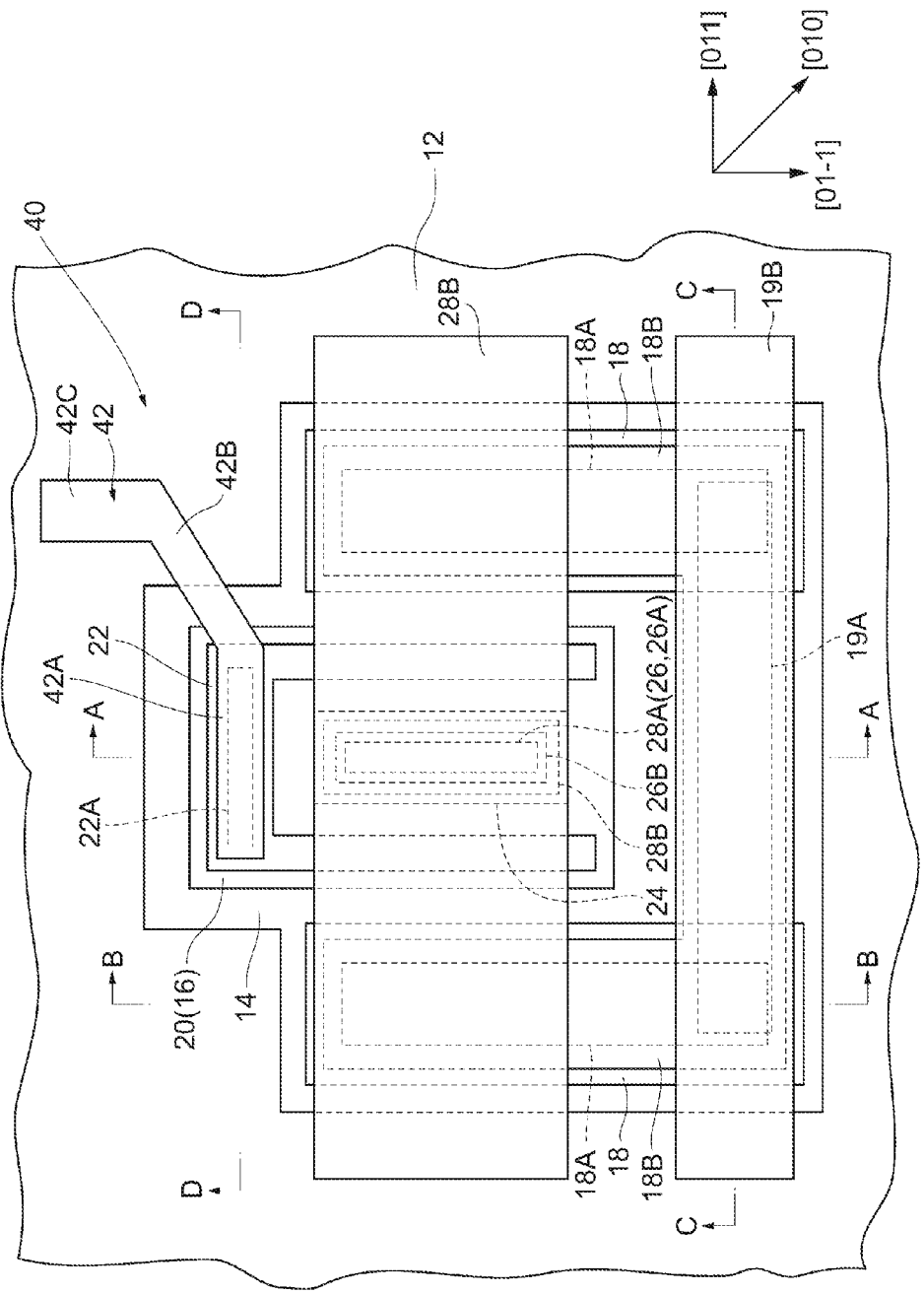
FIG. 6 is a plan view of an HBT as an example of a bipolar transistor according to a second embodiment of the present invention.

FIG. 6 is a plan view of an HBT 40 as an example of a bipolar transistor according to the second embodiment of the present invention.

As illustrated in FIG. 6, the HBT 40 includes a base line 42 connected to a base electrode 22 via a contact hole 22A. The base line 42 is drawn out from an end in the short-side direction of the collector layer. As a result, the base line 42 goes over the side surfaces which are the forward mesa surfaces of the base layer 20, the collector layer 16, and the sub collector layer 14. More specifically, the base line 42 includes a first portion 42A, a second portion 42B, and a third portion 42C.

The first portion 42A is a portion that is present on the base layer 20 and that is connected to the base electrode 22. The first portion 42A has a substantially rectangular shape. The long-side direction of the first portion 42A extends along crystal orientation [011] of the collector layer 16. An end of the first portion 42A is connected to an end of the second portion 42B.

The second portion 42B is a portion of the base line 42 that is drawn out from the base layer 20 to the outside of the sub collector layer 14. The second portion 42B is straightly drawn out from an end in the short-side direction of the collector layer 16 and is drawn out oblique about the end. The other end of the second portion 42B as the drawing destination is connected to one end of the third portion 42C.

The third portion 42C is present on the compound semiconductor substrate 12 and has a substantially rectangular shape. The long-side direction of the third portion 42C extends along crystal orientation [01-1] of the collector layer 16. The other end of the third portion 42C is connected to a collective base line not illustrated. The corner in the vicinity of the boundary between the second portion 42B and the third portion 42C is preferably chamfered from the viewpoint of suppression of peeling-off of the base line 42.

In the HBT 40 according to the second embodiment, the second portion 42B of the base line 42 in a plan view is drawn out oblique about the end in the short-side direction of the collector layer 16. Accordingly, even when the thickness of the second portion 42B in the vicinity of the forward mesa surface of the collector layer 16 or the like is smaller than those of the other portions at the time of manufacturing, it is possible to increase the width of the second portion 42B in the vicinity of the forward mesa surface in comparison with a case where the base line is drawn out in parallel to the short-side direction of the collector layer 16. Accordingly, in the base line 42, the cross-sectional area in the vicinity of the forward mesa surface of the collector layer 16 or the like can be approximated to the cross-sectional areas of the other portions and it is thus possible to further suppress disconnection of the base line 42.

Third Embodiment

A semiconductor device according to a third embodiment of the present invention will be described below.

Figure 7:
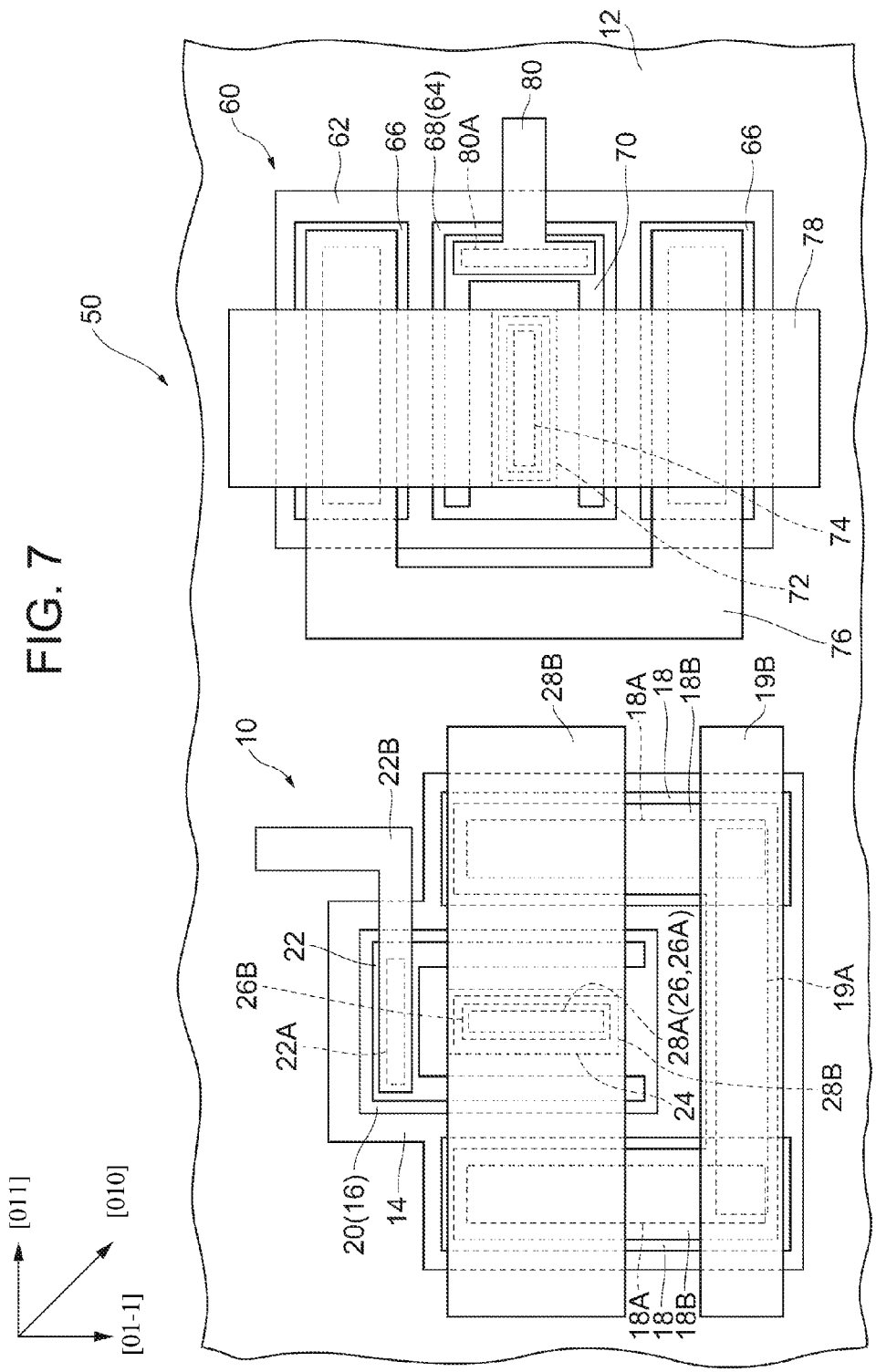
FIG. 7 is a plan view of a semiconductor device according to a third embodiment of the present invention.

FIG. 7 is a plan view of a semiconductor device 50 according to the third embodiment of the present invention.

The semiconductor device 50 according to the third embodiment includes at least one HBT 10 which has been described in the first embodiment and at least one HBT 60 different from the HBT 10 in the base line drawing method.

The HBT 60 includes a sub collector layer 62, a collector layer 64, a collector electrode 66, a base layer 68, a base electrode 70, an emitter layer 72, and an emitter electrode 74. The HBT 60 further includes a collector line 76, an emitter line 78, and a base line 80.

The collector layer 64 and the base layer 68 contain, for example, GaAs as a major component. The collector layer 64 and the base layer 68 have, for example, a rectangular shape. In the collector layer 64 and the base layer 68, the long-side direction thereof extends along crystal orientation [011], the cross-section perpendicular to the short-side direction thereof has an inverted mesa shape, and the cross-section perpendicular to the long-side direction has a forward mesa shape. Similarly, in the sub collector layer 62, the cross-section perpendicular to the short-side direction of the collector layer 64 has an inverted mesa shape, and the cross-section perpendicular to the long-side direction of the collector layer 64 has a forward mesa shape.

The shape of the base line 80 in a plan view is, for example, substantially a T-shape. The straight portion of the base line 80 is connected to the base electrode 70 via a contact hole 80A.

The base line 80 is drawn out from a connection area thereof to the base electrode 70 and from the ends in the long-side direction of the base layer 68 and the collector layer 64 to the outside of the sub collector layer 62. More specifically, in this embodiment, the base line 80 is straightly drawn out along (in parallel to) the long-side direction of the collector layer 64, that is, crystal orientation [011] of the collector layer 64. As a result, the base line 80 goes over the side surfaces which are the forward mesa surfaces of the base layer 68, the collector layer 64, and the sub collector layer 62.

The base line 80 extends along the long-side direction of the collector layer 64 after being drawn out to the outside of the sub collector layer 62. The other end of the base line 80 as an extending destination is connected to a metal pad or the like via a collective base line not illustrated.

The other configurations of the HBT 60 are the same as described in the first embodiment and description thereof will not be repeated.

In the above-mentioned semiconductor device 50 according to the third embodiment, in comparison with a case where the HBTs 60 are simply arranged, the number of directions in which the base line 80 is drawn out and it is thus possible to increase a degree of freedom in layout of the semiconductor device 50. Accordingly, for example, it is possible to decrease the size of the semiconductor device 50.

Fourth Embodiment

A semiconductor device according to a fourth embodiment of the present invention will be described below.

Figure 8:
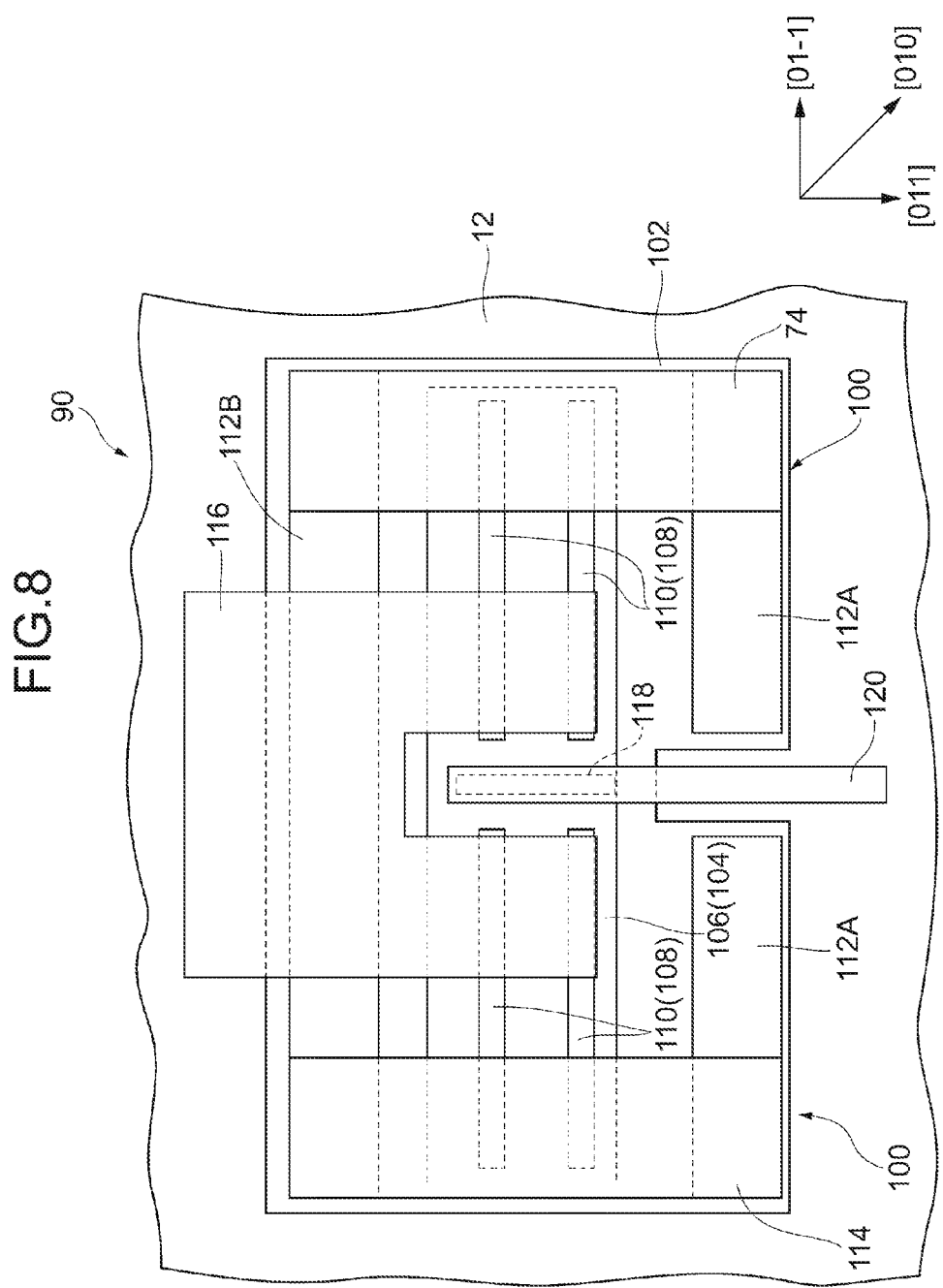
FIG. 8 is a plan view of a semiconductor device according to a fourth embodiment of the present invention.

FIG. 8 is a plan view of a semiconductor device 90 according to the fourth embodiment of the present invention.

The semiconductor device 90 according to the fourth embodiment includes at least two HBTs 100 which are the same as the HBT 10 described in the first embodiment.

In the HBTs 100, a sub collector layer 102, a collector layer 104, and a base layer 106 are used in common. Each HBT 100 individually includes an emitter layer 108 and an emitter electrode 110. Each HBT 100 also individually includes a collector electrode 112A. A collector electrode 112B opposed to the collector electrode 112A is used in common to the HBTs 100. The collector electrodes 112A and the collector electrode 112B are connected to a collector line 114. The emitter electrodes 110 are connected to an emitter line 116.

The collector layer 104 and the base layer 106 contain, for example, GaAs as a major component. The collector layer 104 and the base layer 106 have, for example, a rectangular shape. In the collector layer 104 and the base layer 106, the short-side direction thereof extends along crystal orientation [011], the cross-section perpendicular to the short-side direction thereof has an inverted mesa shape, and the cross-section perpendicular to the long-side direction has a forward mesa shape. Similarly, in the sub collector layer 102, the cross-section perpendicular to the short-side direction of the collector layer 104 has an inverted mesa shape, and the cross-section perpendicular to the long-side direction of the collector layer 104 has a forward mesa shape.

In the HBTs 100, the base electrode 118 and the base line 120 are used in common.

The base line 120 is drawn out from a connection area thereof to the base electrode 118 and from the ends in the short-side direction of the base layer 106 and the collector layer 104 to the outside of the sub collector layer 102. As a result, the base line 120 goes over the side surfaces which are the forward mesa surfaces of the base layer 106, the collector layer 104, and the sub collector layer 102.

The base line 120 extends along the short-side direction of the collector layer 104 after being drawn out to the outside of the sub collector layer 102. The other end of the base line 120 as an extending destination is connected to a metal pad or the like via a collective base line not illustrated.

In the above-mentioned semiconductor device 90 according to the fourth embodiment, since the base electrode 118 and the base line 120 are used in common to the HBTs 100, it is possible to suppress an increase in a contact area between the base layer 106 and the collector layer 104, to suppress an increase in a base-collector capacitance, and to carry out a layout in consideration of balance of power supply positions. Accordingly, for example, it is possible to decrease the size of the semiconductor device 90.

Fifth Embodiment

A semiconductor device according to a fifth embodiment of the present invention will be described below.

Figure 9:
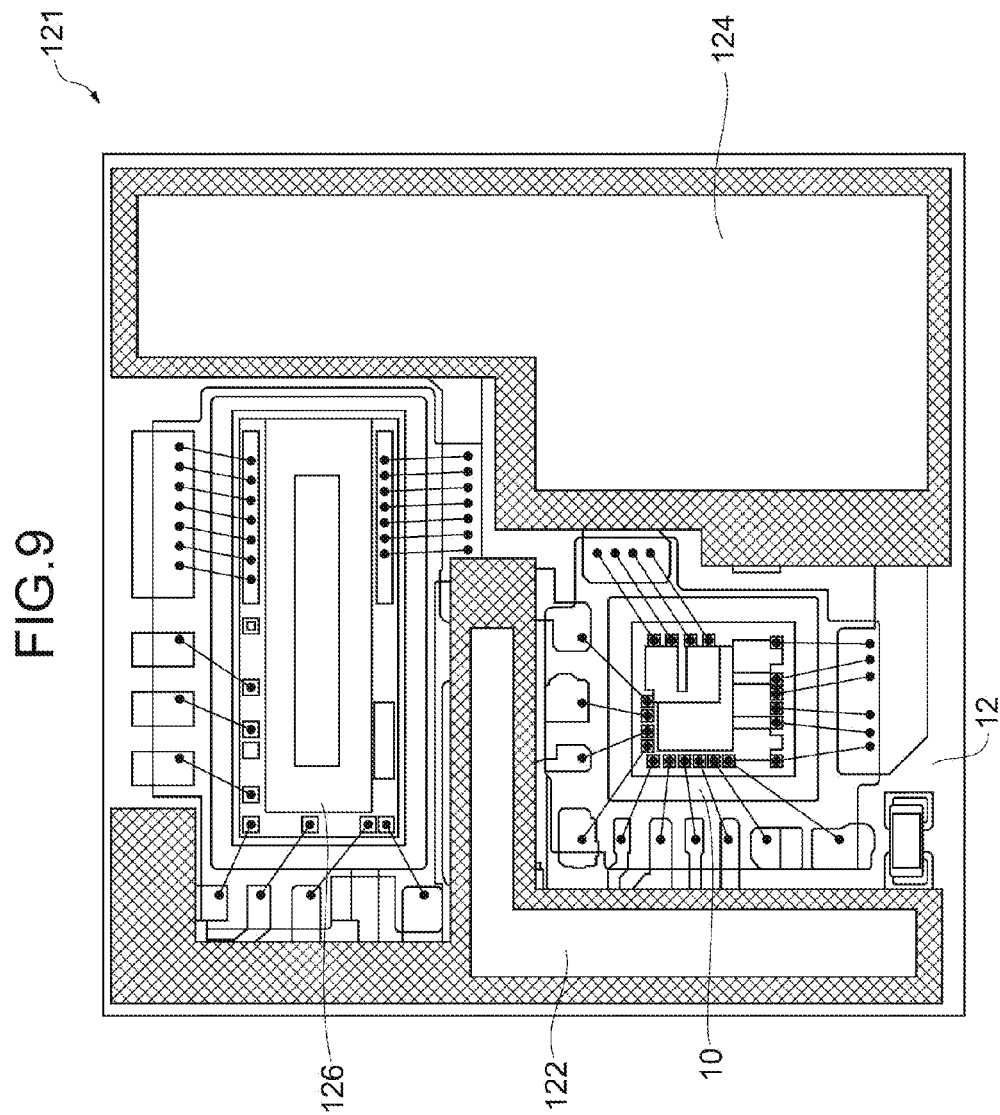
FIG. 9 is a plan view of a semiconductor device according to a fifth embodiment of the present invention.

FIG. 9 is a plan view of a semiconductor device 121 according to the fifth embodiment of the present invention.

As illustrated in FIG. 9, the semiconductor device 121 is an RF power amplifier module. The semiconductor device 121 includes at least one HBT 10 described in the first embodiment and uses the HBT as a power amplifier.

The semiconductor device 121 includes a matching circuit area 122 on the input side of the HBT 10, a matching circuit area 124 on the output side of the HBT 10, and a control chip 126 in addition to the HBT 10.

In the above-mentioned semiconductor device 121 according to the fifth embodiment, since the HBT 10 is used as a power amplifier, it is possible to decrease the size of an RF power amplifier module.

Modification Example

The first to fifth embodiments are presented to facilitate understanding of the present invention, but are not presented to limit the present invention. The present invention can be modified/improved without departing from the gist thereof, and equivalents thereof are also included in the present invention.

For example, use of the sub collector layer 14 may be skipped. Similarly, use of the emitter electrode 26 may be skipped.

When a semiconductor substrate containing Si as a major component instead of the compound semiconductor substrate 12 is used as a substrate, one or more buffer layers may be inserted between the substrate and the sub collector layer 14.

Figure 10:
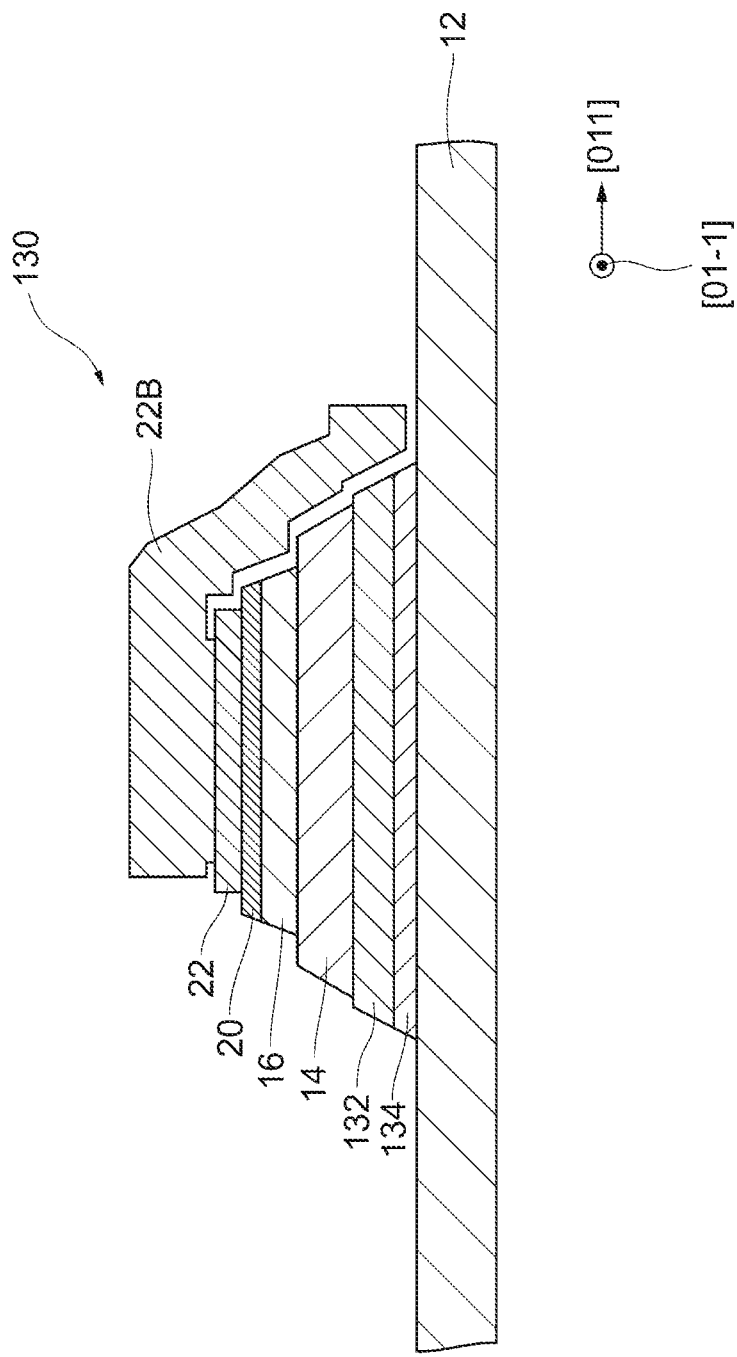
FIG. 10 is a cross-sectional view of a BiFET employing a base line drawing method according to the first embodiment.

In the structure illustrated in FIG. 5, a source/drain ohm contact layer 132 and an FET-section channel layer 134 may be added between the compound semiconductor substrate 12 and the sub collector layer 14 to constitute a BiFET 130 as illustrated in FIG. 10.

It has been described above that the second portion 42B of the base line 42 is straightly drawn out oblique about the end in the short-side direction of the collector layer 16, but the second portion 42B may have a trapezoidal shape, the upper base of which is connected to the first portion 42A and the lower base is connected to the third portion 42C. In this case, the width of the base line 42 increases toward the drawing destination.

The collector electrode 18 does not need to be located on both sides, but the collector electrode 18 may be located on only one side.

What is claimed is:

1. A bipolar transistor comprising:
a sub collector layer formed on a substrate, the sub collector layer having first and second end surfaces, each being perpendicular to crystal orientation [011] and not facing one another, and a third end surface formed between the first and second end surfaces so as to connect the first and second end surfaces, wherein a cross-section perpendicular to the first end surface and a cross-section perpendicular to the second end surface each have a forward mesa shape;
a collector layer formed on the sub collector layer and having a long-side direction and a short-side direction in a plan view, wherein the short-side direction is parallel to the crystal orientation [011], one end of an end surface parallel to the long-side direction faces the second end surface, a cross-section perpendicular to the short-side direction has an inverted mesa shape, and a cross-section perpendicular to the long-side direction has a forward mesa shape;
a collector electrode formed on the sub collector layer and having a long-side direction and a short-side direction in a plan view, wherein the short-side direction of the collector electrode is parallel to the crystal orientation [011] and an end surface parallel to the short-side direction of the collector electrode faces the third end surface;
a base layer formed on the collector layer;
a base electrode formed on the base layer; and
a base line connected to the base electrode, the base line being drawn out from the one end of the end surface parallel to the long-side direction of the collector layer to the substrate via the second end surface of the sub collector layer.

2. The bipolar transistor according to claim 1, wherein the base layer has a long-side direction and a short-side direction in a plan view and the base layer has the same crystal orientation as the collector layer has, the short-side direction of the base layer is parallel to the crystal orientation [011], a cross-section perpendicular to the short-side direction of the base layer has an inverted mesa shape, and a cross-section perpendicular to the long-side direction of the base layer has a forward mesa shape.

3. The bipolar transistor according to claim 1, wherein the substrate is a GaAs substrate.

4. A semiconductor device comprising:
a first bipolar transistor which is the bipolar transistor according to claim 1; and
a second bipolar transistor including: a second collector layer that has a long-side direction and a short-side direction in a plan view, wherein the long-side direction of the second collector layer is parallel to crystal orientation [011], a cross-section perpendicular to the short-side direction of the second collector layer has an inverted mesa shape, and a cross-section perpendicular to the long-side direction of the second collector layer has a forward mesa shape; a second base layer that is formed on the second collector layer; a second base electrode that is formed on the second base layer; and a second base line that is connected to the second base electrode, the second base line being drawn out from an end surface of the second collector layer parallel to the short-side direction of the second collector layer to the outside of the second collector layer in a plan view.

5. A bipolar transistor manufacturing method comprising the steps of:
forming a sub collector layer, a collector layer and a base layer on a substrate;
wet-etching the collector layer and the base layer so that a short-side direction of the collector layer in a plan view is parallel to crystal orientation [011] of the collector layer;
forming a base electrode on the base layer;
wet-etching the sub collector layer so that first, second and third surfaces are formed and that the second end surface faces one end of an end surface of the collector layer parallel to a long-side direction of the collector layer, wherein the first and second surfaces are perpendicular to the crystal orientation [011] and do not face one another, and the third end surface is formed between the first and second end surfaces so as to connect the first and second end surfaces;
forming a collector electrode on the sub collector layer so that a short-side direction of the collector electrode is parallel to the crystal orientation [011] and that an end surface of the collector electrode parallel to the short-side direction of the collector electrode faces the third end surface; and
forming a base line, which is connected to the base electrode and is drawn out from the one end of the end surface of the collector layer parallel to the long-side direction of the collector layer to the substrate via the second end surface of the sub collector layer, using a physical vapor deposition method.

* * * * *